(12) United States Patent
Yao et al.

(10) Patent No.: US 9,499,698 B2
(45) Date of Patent: Nov. 22, 2016

(54) METAL HARDMASK COMPOSITION AND PROCESSES FOR FORMING FINE PATTERNS ON SEMICONDUCTOR SUBSTRATES

(71) Applicant: AZ Electronic Materials (Luxembourg) S.a.r.L., Somerville, NJ (US)

(72) Inventors: Huirong Yao, Plainsboro, NJ (US); Elizabeth Wolfer, Bethlehem, PA (US); Salem K. Mullen, Florham Park, NJ (US); Alberto D. Dioses, Doylestown, PA (US); JoonYeon Cho, Bridgewater, NJ (US)

(73) Assignee: AZ ELECTRONIC MATERIALS (LUXEMBOURG)S.A.R.L., Luxembourg (LU)

( * ) Notice: Subject to any disclaimer, the term of this patent is extended or adjusted under 35 U.S.C. 154(b) by 0 days.

(21) Appl. No.: 14/619,603

(22) Filed: Feb. 11, 2015

(65) Prior Publication Data
US 2016/0230019 A1    Aug. 11, 2016

(51) Int. Cl.
*H01L 21/02* (2006.01)
*H01L 21/308* (2006.01)
*H01L 21/311* (2006.01)
*C09D 5/00* (2006.01)
*G03F 7/11* (2006.01)

(52) U.S. Cl.
CPC ............ *C09D 5/006* (2013.01); *G03F 7/11* (2013.01); *H01L 21/02142* (2013.01); *H01L 21/02172* (2013.01); *H01L 21/02175* (2013.01); *H01L 21/02282* (2013.01); *H01L 21/3081* (2013.01); *H01L 21/3086* (2013.01); *H01L 21/31133* (2013.01); *H01L 21/31138* (2013.01)

(58) Field of Classification Search
CPC ............................ C08K 5/053; C08K 5/0091
See application file for complete search history.

(56) References Cited

U.S. PATENT DOCUMENTS

| | | | |
|---|---|---|---|
| 2,888,367 A * | 5/1959 | Greyson | C08J 7/047 428/422 |
| 3,014,826 A * | 12/1961 | Kohn | H01F 41/0233 29/609 |
| 3,474,054 A | 10/1969 | White | |
| 4,200,729 A | 4/1980 | Calbo | |
| 4,251,665 A | 2/1981 | Calbo | |
| 4,491,628 A | 1/1985 | Ito et al. | |
| 5,187,019 A | 2/1993 | Calbo et al. | |
| 5,350,660 A | 9/1994 | Urano et al. | |
| 5,843,624 A | 12/1998 | Houlihan et al. | |
| 5,879,859 A | 3/1999 | Buchwalter et al. | |
| 6,348,229 B1 | 2/2002 | Aviram et al. | |
| 6,447,980 B1 | 9/2002 | Rahman et al. | |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,416,834 B2 | 8/2008 | Abdallah et al. | |
| 7,799,396 B2 | 9/2010 | Uehara et al. | |
| 8,202,573 B2 | 6/2012 | Pokorny et al. | |
| 8,568,958 B2 | 10/2013 | Yao et al. | |
| 9,296,922 B2 | 3/2016 | Yao et al. | |
| 9,315,636 B2 | 4/2016 | Yao et al. | |
| 2003/0235786 A1 | 12/2003 | Krishnamurthy et al. | |
| 2004/0058275 A1 | 3/2004 | Neef et al. | |
| 2005/0027063 A1 | 2/2005 | Audenaert et al. | |
| 2005/0164133 A1 | 7/2005 | Rangarajan et al. | |
| 2006/0263708 A1 | 11/2006 | Wu et al. | |
| 2007/0134916 A1 | 6/2007 | Iwabuchi et al. | |
| 2007/0243473 A1 * | 10/2007 | Mizushima | G03F 7/001 430/2 |
| 2008/0076064 A1 | 3/2008 | Sun | |
| 2009/0286188 A1 | 11/2009 | Hatakeyama et al. | |
| 2010/0028804 A1 | 2/2010 | Iwato et al. | |
| 2011/0207854 A1 | 8/2011 | Nakamura et al. | |
| 2011/0207864 A1 * | 8/2011 | Nakamura | C08K 5/057 524/310 |
| 2011/0213190 A1 | 9/2011 | Cazaux et al. | |
| 2012/0178261 A1 | 7/2012 | Kanno et al. | |
| 2012/0223418 A1 | 9/2012 | Stowers et al. | |
| 2012/0264039 A1 | 10/2012 | Ito et al. | |
| 2012/0288300 A1 | 11/2012 | Matsusaki et al. | |

(Continued)

FOREIGN PATENT DOCUMENTS

| CN | 1816575 A | 8/2006 |
|---|---|---|
| CN | 101796146 A | 8/2010 |

(Continued)

OTHER PUBLICATIONS

Paul et al. Aust. J. Chem., 1976, 29, 1605-1607.*

(Continued)

*Primary Examiner* — Vu A Nguyen
(74) *Attorney, Agent, or Firm* — Mitchell Brustein

(57) ABSTRACT

The present invention relates to a novel composition with improved stability containing soluble, multi-ligand-substituted metal compound, a polyol compound and a solvent useful for filling material on photoresist patterns with good trench or via filling properties of microlithographic features, where the filled patterns having good plasma etch resistance in oxygen based plasmas and are used as a hard mask in forming fine patterns on semiconductor substrates by pattern transfer of this hard mask. The present invention further relates to using the novel composition in methods for manufacturing electronic devices.

20 Claims, No Drawings

(56) References Cited

U.S. PATENT DOCUMENTS

| | | | |
|---|---|---|---|
| 2014/0087066 A1* | 3/2014 | Wang | C08F 220/10 427/126.4 |
| 2014/0159278 A1 | 6/2014 | Yao et al. | |
| 2015/0064904 A1 | 3/2015 | Yao et al. | |

FOREIGN PATENT DOCUMENTS

| | | |
|---|---|---|
| JP | 63-56529 A | 3/1988 |
| WO | 2011032837 A1 | 3/2011 |

OTHER PUBLICATIONS

Form PCT/ISA/220, Form PCT/ISA/210, and Form PCT/ISA/237 for PCT/EP2013/075815 dated Jul. 9, 2014 which corresponds to U.S. Appl. No. 13/707,993.
English Language Abstract from JPO of JP 63-56529 A.
Form PCT/ISA/220, Form PCT/ISA/210, and Form PCT/ISA/237 for PCT/IB2012/001219 dated Oct. 19, 2012, which corresponds to U.S. Appl. No. 13/164,869.
Form PCT/IB/326, Form PCT/IB/373, and Form PCT/ISA/237 for PCT/IB2012/001219 dated Jan. 9, 2014, which corresponds to U.S. Appl. No. 13/164,869.
Notification of the First Office Action dated Sep. 1, 2014 from the Chinese Patent Office for CN2012800262639, which corresponds to U.S. Appl. No. 13/164,869.
English Translation of Notification of the First Office Action dated Sep. 1, 2014 from the Chinese Patent Office for CN2012800262639, which corresponds to U.S. Appl. No. 13/164,869.
Restriction Requirement notification date Mar. 12, 2015 for U.S. Appl. No. 13/707,993.
Form PCT/ISA/220, Form PCT/ISA/210, and Form PCT/ISA/237 dated Nov. 28, 2014 for PCT/EP2014/067749, which corresponds to U.S. Appl. No. 14/015,222.
"Alkylenes", PAC, 1995, 67, 1307, (Glossary of class names of organice compounds and reactivity intermediates based on structure (IUPAC Recommendations 1995) on p. 1314, obtained from hhtp://goldbook.iupac.org/!00227-plain.html on Mar. 11, 2013.
J. H. Baxendale et al., "The Reduction of Molybdenum(II) Trifluoroacetate by Pulse Radiolysis in Methanol1", Journal of the American Chemical Society vol. 98 No. 2, pp. 637-pp. 638 (1976).

G. M. Burch et al., "Scrambling of Fluoro-, Methoxyl, Dimethylamino-, and Methyl Gropus with Chlorine Atoms of Methoxyl with Dimethylaminol-Groups on Germanium", J. Chm. Soc. (A), pp. 586-pp. 589 (1966).
P. Sartori et al., "Uber die Darstellung und Eigenschaften von Perflouracyloxy-Verbindungen der vierten Gruppe des Periodensystems*", Chem. Ber. vol. 100 No. 6, pp. 2049-pp. 2063 (1967).
Nonfinal Office Action notification date Aug. 27, 2015 for U.S. Appl. No. 13/707,993.
Restriction Requirement notification date May 11, 2015 for U.S. Appl. No. 14/015,222.
Notification Concerning Transmittal of International Preliminary Report on Patentability (Chapter I of the Patent Cooperation Treaty (Form PCT/IB/326), International Preliminary Report on Patentability (Form PCT/IB/373), and Written Opinion of the International Searching Authority (Form PCT/ISA/237) for PCT/EP2014/067749 dated Mar. 10, 2016, which corresponds to U.S. Appl. No. 14/015,222.
Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PT/ISA/237) dated May 20, 2016 for PCT/EP2016/052167, which corresponds to U.S. Appl. No. 14/619,603.
Junhua Jia et al., "Multi-Dimensional Transition-Metal Coodination Polymers of 4,4'-Bipyridine-N,N'-dioxide: 1D Chains and 2D Sheets", Inorg. Chem. vol. 47 No. 19, pp. 8652-pp. 8664 (2008).
Timothy V. Lubben et al., "Dioxygen Activation by Group 4 tritox Alkyls (tritox = t-Bu3CO-): Insertion and Oxygen Atom transfer", J. Am. Chem. Soc. vol. 109 No. 2, pp. 242-pp. 435 (1987).
Patrice M. T. Piggot et al., "Synthesis, Structure, and Magnetochemical Analysis of Selected First-Row Transition-Metal Anilino- and Anisolesquarate Compounds", Inorg. Chem. vol. 43 No. 3, pp. 1167-pp. 1174 (2004).
Maria Felisa Zuniga et al., "Lithium Aryloxo Magnesiates: an Examination of Ligand Size and Donor Effects", Inorg. Chem. vol. 46 No. 24, pp. 10400-pp. 10409 (2007).
Office Action with Search Report for TW101122288 delivery date Jan. 1, 2016, which corresponds to U.S. Appl. No. 13/164,869.

* cited by examiner

METAL HARDMASK COMPOSITION AND PROCESSES FOR FORMING FINE PATTERNS ON SEMICONDUCTOR SUBSTRATES

FIELD OF INVENTION

The present invention relates to compositions comprising a polyol additive and a soluble, multi-ligand-substituted metal compound, which are useful as metal hard masks which show improved void filling capacity for trench or via microlithographic features, and also good plasma etch resistance in oxygen based plasmas; these compositions are used in processes for forming fine patterns on semiconductor substrates by pattern transfer of the hard mask.

BACKGROUND

Metal oxide films are useful in a variety of applications in the semiconductor industry such as, lithographic hardmasks, underlayers for antireflective coatings and electro-optical devices.

As an example, photoresist compositions are used in microlithography processes for making miniaturized electronic components such as in the fabrication of computer chips and integrated circuits. Generally, a thin coating of a photoresist composition is applied to a substrate, such as a silicon wafer used for making integrated circuits. The coated substrate is then baked to remove a desired amount of solvent from the photoresist. The photoresist film on the substrate is then image-wise exposed to actinic radiation, such as, visible, ultraviolet, extreme ultraviolet, electron beam, particle beam and X-ray radiation and developed to form a pattern. The radiation causes a chemical transformation in the exposed areas of the photoresist. The exposed coating is treated with a developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization.

Absorbing antireflective coatings and underlayers in photolithography are used to diminish problems that result from radiation that reflects from substrates which often are highly reflective. Reflected radiation results in thin film interference effects and reflective notching. Thin film interference, or standing waves, result in changes in critical line width dimensions caused by variations in the total light intensity in the photoresist film as the thickness of the photoresist changes. Interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete loss of desired dimensions. An antireflective coating film coated beneath a photoresist and above a reflective substrate provides significant improvement in lithographic performance of the photoresist. Typically, the bottom antireflective coating is applied on the substrate and cured, followed by application of a layer of photoresist. The photoresist is imagewise exposed and developed. The antireflective coating in the exposed area is then typically dry etched using various etching gases, and the photoresist pattern is thus transferred to the substrate.

Underlayers containing high amount of refractory elements can be used as hard masks as well as antireflective coatings. Hard masks are useful when the overlying photoresist is not capable of providing high enough resistance to dry etching that is used to transfer the image into the underlying semiconductor substrate. In such circumstances a material called a hard mask is used whose etch resistance is high enough to transfer any patterns created over it into the underlying semiconductor substrate. This is made possible because the organic photoresist is different than the underlying hard mask and it is possible to find an etch gas mixture which will allow the transfer of the image in the photoresist into the underlying hard mask. This patterned hard mask can then be used with appropriate etch conditions and gas mixtures to transfer the image from the hard mask into the semiconductor substrate, a task which the photoresist by itself with a single etch process could not have accomplished.

Multiple antireflective layers and underlayers are being used in new lithographic techniques. In cases where the photoresist does not provide sufficient dry etch resistance, underlayers and/or antireflective coatings for the photoresist that act as a hard mask and are highly etch resistant during substrate etching are preferred. One approach has been to incorporate silicon, titanium or other metallic materials into a layer beneath the organic photoresist layer. Additionally, another high carbon content antireflective or mask layer may be placed beneath the metal containing antireflective layer, such as a trilayer of high carbon film/hardmask film/photoresist is used to improve the lithographic performance of the imaging process. Conventional hard masks can be applied by chemical vapor deposition, such as sputtering. However, the relative simplicity of spin coating versus the aforementioned conventional approaches makes the development of a new spin-on hard mask or antireflective coating with high concentration of metallic materials in the film very desirable.

Underlayer compositions for semiconductor applications containing metal oxides have been shown to provide dry etch resistance as well as antireflective properties. Conventional soluble metal compounds to form metal oxide films, such as metal alkoxides, however, have been found to be very unstable to moisture in air thus creating a variety of issues, including shelf life stability, coating problems and performance shortcomings. Metal oxides have solubility problems in solvents typically used and accepted in the semiconductor industry. Thus there is an outstanding need to prepare spin-on hardmask, and other underlayers that contain organic solvents soluble metal compounds which are stable after exposure to air. There is also a need for such underlayer formulations which can additionally act as good via and trench filling materials showing very low void formation, which can be accomplished with the present inventive composition. Such filled lithographic features with low void formation can then be employed as a negative tone hard mask to yield, after plasma etching, a reverse tone image of the original photoresist pattern. When the patterned substrate is part of an electronic device, the novel composition alternatively can be employed as a filling material which is partially stripped in chemical solutions after curing of the film to form metal oxide. The remaining metal oxide film in the feature then can be used as a high K (dielectric) material for gate dielectrics to improve current leakage. Normally these materials are always deposited using CVD (chemical vapor deposition) process that is expensive and needs special equipment. In either application the metal oxide hardmask material is strippable in chemical solutions after curing. The chemical strippers can be acid or basic aqueous solutions such as SC1 ($H_2O:H_2O_2:NH_4OH=20:4:1$), Piranha ($H_2SO_4:30\% H_2O_2=2:3$), diluted HF, NH4F, phosphoric acid, 300 MIF developer, or simply a solvent or a solvent mixture.

SUMMARY OF THE INVENTION

The present invention relates to novel compositions comprising a soluble, multi-ligand-substituted metal compound, a polyol compound and a solvent.

The present invention relates to a composition comprising;

a) a soluble, multi-ligand-substituted metal compound of structure (I)

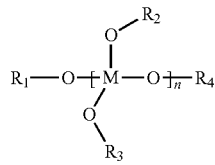

wherein M is a metal having (4) valence and n is 1 to 20, and wherein $R_1$, $R_2$, $R_3$, and $R_4$ are moieties independently selected from 1), 2), 3), or mixture thereof, where 1) is an organic moiety (II),

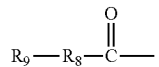

wherein $R_8$ is selected from the group consisting of $C_2$-$C_{10}$ alkylene, $C_3$-$C_{12}$ branched alkylene, $C_5$-$C_{12}$ cycloalkylene, $C_2$-$C_{10}$ alkylene containing a C═C double bond, $C_3$-$C_{12}$ branched alkylene containing a C═C double bond, and $C_5$-$C_{12}$ cycloalkylene containing a C═C double bond, and further where $R_9$ is hydrogen or the alkyloxycarbonyl moiety (IV), where $R_{10}$ is $C_1$-$C_8$ alkyl group,

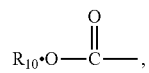

2) is a silicon bearing organic moiety having at least 2 carbons having structure (III)

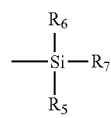

wherein $R_5$ and $R_6$, are independently selected from $C_1$-$C_8$ alkyl, $C_3$-$C_{12}$ branched alkyl, or aryl, $R_7$ is independently selected from $C_1$-$C_8$ alkyl, aryl, hydroxyl, or siloxane of structure (V) where $R_{11}$ is hydrogen, a $C_1$-$C_8$ alkyl moiety, a $C_1$-$C_8$ alkyl moiety substituted with a hydroxyl group, or an aryl moiety, and $R_{12}$ and $R_{13}$ are independently selected from $C_1$-$C_8$ alkyl moiety, a $C_3$-$C_{12}$ branched alkyl moiety, or an aryl moiety and where p represents the number of repeat units in the siloxane moiety (V); and,

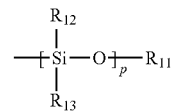

3) is an organic moiety selected from the group consisting of a $C_2$-$C_8$ alkyl, a $C_6$-$C_{16}$ aryl or substituted aryl, a $C_2$-$C_8$ alkyl carboxyl, a $C_6$-$C_{16}$ aryl or substituted aryl carboxyl, a fluorinated $C_2$-$C_8$ alkyl carboxyl, a fluorinated $C_6$-$C_{16}$ aryl or substituted aryl carboxyl, a $C_2$-$C_8$ alkyl sulfonyl, a $C_6$-$C_{16}$ aryl or substituted aryl sulfonyl, a fluorinated $C_2$-$C_8$ alkyl sulfonyl, a fluorinated $C_6$-$C_{16}$ aryl or substituted aryl sulfonyl, and mixtures thereof;

b) polyol compound having structure (VI)

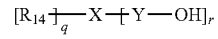

where X is C or N, where r is at least 2 and q ranges from 0-2, and where the sum of q and r is 4 when X is C and the sum of q and r is 3 when X is N, and further where $R_{14}$ is hydrogen, a C1 to $C_8$ alkyl moiety or a $C_2$ to $C_8$ hydroxyalkylene moiety; and when X is N, Y is a $C_2$-$C_8$ alkylene moiety; when X is C, Y is independently chosen from a direct valence bond, a $C_2$-$C_8$ alkylene moiety, or a moiety containing an alkoxy alkylene chain having structure (VII) where $R_{15}$ is a $C_2$ to $C_8$ alkylene moiety, t is 0 to 2 and t' is 1 to 2;

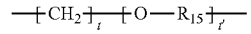

and, c) a solvent.

The present invention further relates to using the novel compositions in methods for manufacturing electronic devices. The present invention further relates to using these novel compositions to coat a patterned photoresist to form filled photoresist patterns with low void formation, and using these filled photoresist patterns as a negative tone hardmask where the non-filled areas of the photoresist are removed with an appropriate plasma such as an oxygen plasma to affect image tone reversal. The invention also relates to removing the composition using a stripper.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "and/or" refers to any combination of the foregoing elements including using a single element.

As used herein the term "alkyl" refers to straight, or cyclic chain alkyl substituents as well as any of their branched isomers.

As used herein the term "alkylene" refers to straight chain di-functionalized alkylene substituents having the general formula —$CH_2$—$(CH_2)_n$—$CH_2$—.

As used herein the term "branched alkylene" refers an alkylene substituent which either has alkyl substituents present.

As used herein the term "cyclic alkylene" refers a disubstituted hydrocarbon moiety containing a cyclic hydrocarbon, the attachment points may either be on the cyclic hydrocarbon itself or on a pendant hydrocarbon substituent on the cyclic hydrocarbon.

As used herein the term "aryl" refers to any functional group or substituent derived from an aromatic ring, such as phenyl, naphthyl, thienyl, indolyl etc.

As used herein the term "diketone" refers to any solvent having two ketone groups non limiting examples are diacetyl, acetylacetone, and hexane-2,5-dione.

As used herein the term "silicon-based polymer" refers to silicon polymers as well as organosilicon polymers and include the lower mer materials such as dimer, trimer and the like.

As used herein the terms "composition" and "formulation" are used interchangeable and mean the same thing.

The present invention relates to novel compositions comprising a soluble, multi-ligand-substituted metal compound, a polyol compound and a solvent.

The present invention relates to a composition comprising;
  a) a soluble, multi-ligand-substituted metal compound of structure (I)

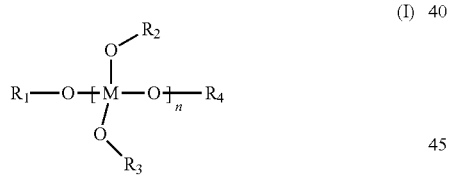

(I)

wherein M is a metal having a valence of 4 and n is 1 to 20, and wherein $R_1$, $R_2$, $R_3$, and $R_4$ are moieties independently selected from 1), 2), 3), or mixture thereof, where
  1) is an organic moiety (II),

(II)

wherein $R_8$ is selected from the group consisting of $C_2$-$C_{10}$ alkylene, $C_3$-$C_{12}$ branched alkylene, $C_5$-$C_{12}$ cycloalkylene, $C_2$-$C_{10}$ alkylene containing a C=C double bond, $C_3$-$C_{12}$ branched alkylene containing a C=C double bond, and $C_5$-$C_{12}$ cycloalkylene containing a C=C double bond, and further where $R_9$ is hydrogen or the alkyloxycarbonyl moiety (IV), where $R_{10}$ is $C_1$-$C_8$ alkyl group;

(IV)

2) is a silicon bearing organic moiety having at least 2 carbons having structure (III)

(III)

wherein $R_5$ and $R_6$, are independently selected from $C_1$-$C_8$ alkyl, $C_3$-$C_{12}$ branched alkyl, or aryl, $R_7$ is independently selected from $C_1$-$C_8$ alkyl, aryl, hydroxyl, or siloxane of structure (V) where $R_{11}$ is hydrogen, a $C_1$-$C_8$ alkyl moiety, a $C_1$-$C_8$ alkyl moiety substituted with a hydroxyl group, or an aryl moiety, and $R_{12}$ and $R_{13}$ are independently selected from $C_1$-$C_8$ alkyl moiety, a $C_3$-$C_{12}$ branched alkyl moiety, or an aryl moiety and where p represents the number of repeat units in the siloxane moiety (V); and,

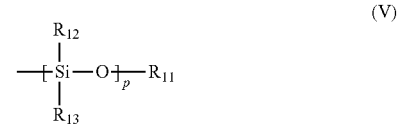

(V)

3) is an organic moiety selected from the group consisting of a $C_2$-$C_8$ alkyl, a $C_6$-$C_{16}$ aryl or substituted aryl, a $C_2$-$C_8$ alkyl carboxyl, a $C_6$-$C_{16}$ aryl or substituted aryl carboxyl, a fluorinated $C_2$-$C_8$ alkyl carboxyl, a fluorinated $C_6$-$C_{16}$ aryl or substituted aryl carboxyl, a $C_2$-$C_8$ alkyl sulfonyl, a $C_6$-$C_{16}$ aryl or substituted aryl sulfonyl, a fluorinated $C_2$-$C_8$ alkyl sulfonyl, a fluorinated $C_6$-$C_{16}$ aryl or substituted aryl sulfonyl, and mixtures thereof;
  b) polyol compound having structure (VI)

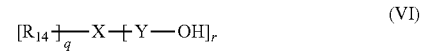

(VI)

where X is C or N, where r is at least 2 and q ranges from 0-2, and where the sum of q and r is 4 when X is C and the sum of q and r is 3 when X is N, and further where $R_{14}$ is hydrogen, a C1 to $C_8$ alkyl moiety or a $C_2$ to $C_8$ hydroxyalkylene moiety; and when X is N, Y is a $C_2$-$C_8$ alkylene moiety; when X is C, Y is independently chosen from a direct valence bond, a $C_2$-$C_8$ alkylene moiety, or a moiety containing an alkoxy alkylene chain having structure (VII) where $R_{15}$ is a $C_2$ to $C_8$ alkylene moiety, t is 0 to 2 and t' is 1 to 2;

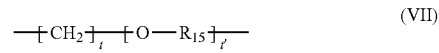

(VII)

and, c) a solvent.

The soluble, multi-ligand-substituted metal compound in the novel composition has structure (I)

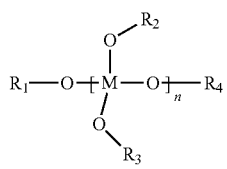
(I)

wherein M is a metal having a valence of 4 and n is 1 to 20, and wherein $R_1$, $R_2$, $R_3$, and $R_4$ are moieties independently selected from 1), 2), 3), or mixture thereof, where 1) is an organic moiety (II),

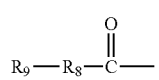
(II)

wherein $R_8$ is selected from the group consisting of $C_2$-$C_{10}$ alkylene, $C_3$-$C_{12}$ branched alkylene, $C_5$-$C_{12}$ cycloalkylene, $C_2$-$C_{10}$ alkylene containing a C=C double bond, $C_3$-$C_{12}$ branched alkylene containing a C=C double bond, and $C_5$-$C_{12}$ cycloalkylene containing a C=C double bond, and further where $R_9$ is hydrogen or the alkyloxycarbonyl moiety (IV), where $R_{10}$ is $C_1$-$C_8$ alkyl group;

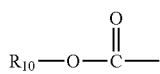
(IV)

2) is a silicon bearing organic moiety having at least 2 carbons having structure (III)

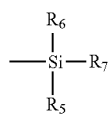
(III)

wherein $R_5$ and $R_6$, are independently selected from $C_1$-$C_8$ alkyl, $C_3$-$C_{12}$ branched alkyl, or aryl, $R_7$ is independently selected from $C_1$-$C_8$ alkyl, aryl, hydroxyl, or siloxane of structure (V) where $R_{11}$ is hydrogen, a $C_1$-$C_8$ alkyl moiety, a $C_1$-$C_8$ alkyl moiety substituted with a hydroxyl group, or an aryl moiety, and $R_{12}$ and $R_{13}$ are independently selected from $C_1$-$C_8$ alkyl moiety, a $C_3$-$C_{12}$ branched alkyl moiety, or an aryl moiety and where p represents the number of repeat units in the siloxane moiety (V); and,

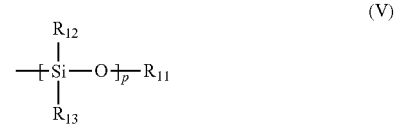
(V)

3) is an organic moiety selected from the group consisting of a $C_2$-$C_8$ alkyl, a $C_6$-$C_{16}$ aryl or substituted aryl, a $C_2$-$C_8$ alkyl carboxyl, a $C_6$-$C_{16}$ aryl or substituted aryl carboxyl, a fluorinated $C_2$-$C_8$ alkyl carboxyl, a fluorinated $C_6$-$C_{16}$ aryl or substituted aryl carboxyl, a $C_2$-$C_8$ alkyl sulfonyl, a $C_6$-$C_{16}$ aryl or substituted aryl sulfonyl, a fluorinated $C_2$-$C_8$ alkyl sulfonyl, a fluorinated $C_6$-$C_{16}$ aryl or substituted aryl sulfonyl, and mixtures thereof;

The preparation of the multi-ligand-substituted metal compound of the current invention is prepared from their alkoxides or acetylacetonates (acac), as described below. The alkoxy or acac metal compounds are reacted with a SiOH containing compound (e.g. trimethylsilanol), oligomer or polymer (e.g. polydimethylsiloxane (hydroxyl ended)) which yield the silicon bearing organic moiety 2) having at least 2 carbons; then followed by reaction with anhydrides, cyclic anhydrides or a carboxylic acid to yield the organic moiety (II). The optional $C_1$-$C_8$ alkyl substituent which may constitute some of the $R_1$, $R_2$, $R_3$, $R_4$ groups on the multi-ligand-substituted metal compound may result either from residual alkoxide from an alkoxide metal precursor or by using a $C_1$-$C_8$ alcohol as an additional reagent in the preparation of the multi-ligand-substituted metal compound. The reaction is done in a solvent which can dissolve both the alkoxide or acac precursor, and other reagents. Typical solvents or solvent mixtures for the reaction contain ester, ether and alcoholic functional group, for instance a 70/30 by volume mixture of propylene glycol methyl ether acetate (PGMEA) and propylene glycol methyl ether (PGME). Other solvent can be used are hydrocarbons such as cyclohexane, benzene, toluene, etc.

It should be noted that more than two ligands may be used to react with the alkoxy metal as desired.

One embodiment of the invention is where in the composition the soluble, multi-ligand-substituted metal compound having structure (I), has $R_1$, $R_2$, $R_3$, and $R_4$ selected from the group consisting of moieties 1), 2) and mixtures thereof.

Another embodiment of the composition is wherein the soluble, multi-ligand-substituted metal compound having structure (I), the moiety 2), the silicon bearing moiety bearing an organic moiety having at least 2 carbons of structure (III), ranges in content from 30 mole % to 60 mole % of the total moles of moieties $R_1$, $R_2$, $R_3$, and $R_4$, in structure (I), and further where the organic moiety 1) of structure (II) ranges in content from 30 mole % to 60 mole % of the total moles of moieties $R_1$, $R_2$, $R_3$, and $R_4$ in structure (I).

A further embodiment of the invention is where in structure (I) the metal having a (4) valence can be selected from a group chosen from silicon (4), titanium (4), zirconium (4), tantalum (4), lead (4), hafnium (4), molybdenum (4), germanium (4), tin (4), tungsten (4) and other transition metals having (4) valence. The metal compound may be monoatomic, n being about 1. The metal compound may also be polyatomic, n ranging from about 2 to about 20, creating a chain of alternating metal-oxygen segments. The polyatomic compound may contain only one type of metal atom, such as, for example, titanium, or they may have other metals dispersed into the metal-oxo backbone, such as silicon and zirconium. The amount of each metal in a mixed metal polyatomic metal compound can range from 0.001% to 99.999% depending on the desired characteristics of the final cured metal oxide layer. These novel metal compounds are stable even after exposure to air, have good filling properties and are also strippable in chemical solutions.

In one embodiment of this novel composition component a), the soluble, multi-ligand-substituted metal compound having structure (I), has n in the range of 2 to 20. Another aspect this invention is where the soluble, multi-ligand-substituted metal compound having structure (I) may have more than one metal when n is 2 to 20.

In another embodiment of this novel composition, component a), the soluble, multi-ligand-substituted metal compound having structure (I), has n equal to 1.

Possible metals for the multi-ligand-substituted metal compound of structure (I) are Ti, Zr and Hf.

In another embodiment the silicon bearing organic moiety 2) having at least 2 carbon which has structure (III), may be selected from the group consisting of

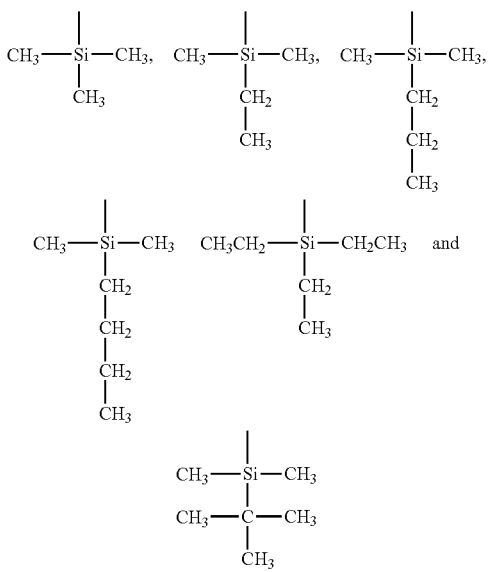

In another embodiment of this invention the novel composition is comprised of a soluble, multi-ligand-substituted metal compound of structure (I), in which the silicon bearing organic moiety having at least 2 carbon having structure (III), has a $R_7$ group having structure (V).

In another preferred embodiment of this novel composition the soluble, multi-ligand-substituted metal compound having structure (I), the organic moiety II) is selected from the group consisting of

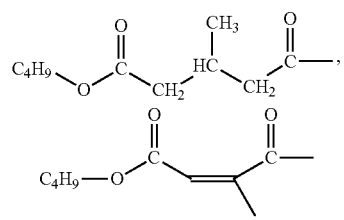

-continued

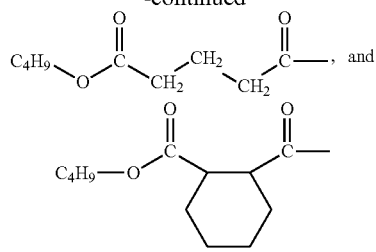

In another aspect of this invention the soluble, multi-ligand-substituted metal compounds of structure (I) has at least one of $R_1$, $R_2$, $R_3$, and $R_4$ chosen from moiety 3), an organic moiety, where this moiety is further selected from the group consisting of a $C_1$-$C_8$ alkyl moiety which is present from 0 mole % to 50 mole % of the total of the groups $R_1$, $R_2$, $R_3$, and $R_4$.

In another aspect of this invention, the soluble, multi-ligand-substituted metal compound having structure (I), has $R_1$, $R_2$, $R_3$, and $R_4$ selected from the group consisting of moieties 1) and 2) wherein moiety 1) is present from 30-60 mol % and moiety 2) is present from 30-60 mol % of the total moieties.

The polyol compound in the novel composition has structure (VI), $$[R_{14}]_q-X-[Y-OH]_r \quad (VI)$$

where X is C or N, and where q and r are respectively the number of moieties, $R_{14}$— and —Y—OH, attached to X; where r is at least 2 and q ranges from 0-2 and where the sum of q and r is 4 when X is C and the sum of q and r is 3 when X is N; and further where $R_{14}$ is hydrogen, a C1 to $C_8$ alkyl moiety or a $C_2$ to $C_8$ hydroxyalkylene moiety; and further, when X is N, Y is a $C_2$-$C_8$ alkylene moiety, when X is C, Y is independently chosen from a direct valence bond, a $C_2$-$C_8$ alkylene moiety or a moiety containing an alkoxy alkylene chain having structure (VII) where $R_{15}$ is a $C_2$ to $C_8$ alkylene moiety, and t represents the number of alkoxy alkylene units present in the alkoxy alkylene chain, t is 0 to 2 and t' is 1 to 2.

$$-[CH_2]_t-[O-R_{15}]_{t'}- \quad (VII)$$

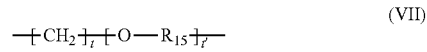

In another aspect of this novel composition the polyol additive having structure (VI), has Y having structure (VII) and further where this polyol additive also has a weight average molecular weight less than 500 and a boiling point higher than 250° C. In one embodiment of this aspect of the inventive formulation, the polyol additives has structure (VI), has Y having structure (VII) and also has a weight average molecular weight less than 300 and a boiling point higher than 300° C.

Another aspect of this novel composition is where the polyol additive having structure (VI), where Y has structure (VII), is chosen from the group consisting of tetraethylene glycol, triethylene glycol, glycerol, triethanolamine, diethanolamine, neopentyl glycol, glycerol propoxylate and pentaerythritol ethoxylate.

Another aspect of this novel composition is where the polyol additives having structure (VI), where Y has structure (VII) is chosen from the group consisting of compounds having structure VIII, IX, X, XI, and XII

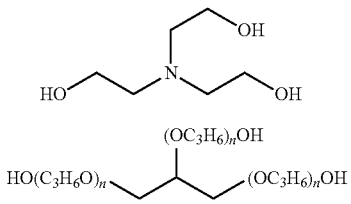
(VIII)

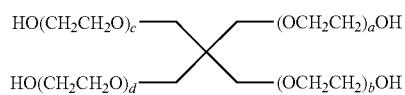
(IX)

where n=1-2

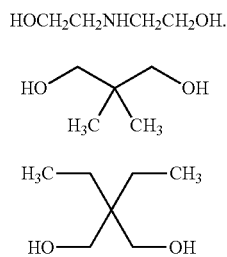
(X)

where a+b+c+d=3-4

HOCH₂CH₂NHCH₂CH₂OH.  (XI)

(XII)

(XIII)

Disclosed herein also are the novel compositions where the solvent, may be chosen from a solvent or solvent mixture containing an alcohol, an ester, a ketone, a carboxylic acid, an amide, an aromatic moiety, or a diketone. Specific examples of suitable solvents are lower alcohols ($C_1$-$C_6$) such as isopropanol, n-butanol, t-butanol, 1-pentanol and 4-methyl-2-pentanol, a glycol such as ethylene glycol and propylene glycol, diketones such as diacetyl, acetylacetone, and hexane-2,5-dione, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxalate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxy alcohol such as 1-Methoxy-2-propanol, 2-methoxyethanol, ethoxyethanol, an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone and gamma-velaro lactone; an amide derivative such as dimethylacetamide or dimethylformamide, aromatic solvents such as anisole, and mixtures thereof.

The novel compositions of the present invention may contain additional components such as surfactant, levelling agents, crosslinking additives, and thermally activated catalysts which enhance the performance of the coating, e.g. lower alcohols ($C_1$-$C_6$ alcohols), alkoxyalcohols, lactones, $C_1$-$C_{20}$ alkyl carboxylic acids, surface leveling agents (<5 weight % of total solids), dialkoxy bis(betadiketoesters) (1-20 weight % or 5-10 weight % of total solids), dialkoxy bis(beta diketone) (1-20 weight % or 5-10 weight % of total solids), thermal acid generator, photoacid generator, thermal base generators or thermal radical generators. Dialkoxy bis(betadiketoesters) and dialkoxy bis(beta diketone) can be acetylacetone, benzoylacetone, 4,4,4-Trifluoro-1-phenyl-1, 3-butanedione, and ethyl acetoacetate.

Surface leveling agents or surfactants can be polyethylene glycol dodecyl ether, polyoxyethylene oleyl ether, polyethylene glycol octadecyl ether, polyethylene glycol tert-octylphenyl ether, fluorine based surfactant, and silicon based surfactant. Surfactants with the following trade names may be used, Brij30, Brij52, Triton X-100, FC4430, KP341, etc.

In order to further crosslink the novel composition, crosslinking additives may be added, including, for example, bisphenol A-based epoxy compounds, bisphenol F-based epoxy compounds, bisphenol S-based epoxy compounds, the novolac resin-based epoxy, poly (hydroxystyrene)-based epoxy compounds, melamine compounds, benzoguanamine compounds, and urea compounds.

Thermally activated catalysts, such as thermal acid generators, may also be added to the novel composition to aid in crosslinking during thermal curing of the coated composition. The thermal acid generator can be activated at above 90° C. for example above 120° C., or above 150° C. Examples of thermal acid generators include metal-free sulfonium salts and iodonium salts, such as triarylsulfonium, dialkylarylsulfonium, and diarylakylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. 2-nitrobenzyl esters of alkyl or arylsulfonic acids and other esters of sulfonic acid which thermally decompose to give free sulfonic acids. Other examples include diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium or quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200, 729, 4,251,665 and 5,187,019. The TAG may have a very low volatility at temperatures between 170-220° C.

Thermally activated peroxides may also be used in the current composition, such as, for example, benzoyl peroxide, 3,5-dichlorobenzoperoxide and the like.

In one aspect of the novel composition, the polyol has a content less than 60 wt % of total solids and greater than 3 wt % of total solids in the composition. In another aspect of this invention the polyol has a content less than 40 wt of total solids and greater than 5 wt % in the composition.

Another aspect of this novel composition is where the total % wt solids content of the metal component and the polyol component in solution ranges from 0.5-50 wt % of total solids. A preferred embodiment of this aspect of the invention is where the total % wt solid content of the metal component and the polyol component in solution ranges from 01-35%.

Two or more metal compounds with the same or different metal can be used in formulations. The total metal compounds, when used, is in the range of 40-97 wt % or 60-95 wt % based on total solid content.

The crosslinking additive may be present between 2-15 weight % based on solids. Other additives may be added, such as, for example, wetting agents, surfactants, anti-foam agent, thixotropic agents and the like.

The novel compositions are stable when exposed to air and then stored. The materials may be exposed to air for up to 24 hours and then stored for at least 1 week without any deterioration of lithographic properties, such as coating defects. Furthermore, the novel materials can be removed by wet stripping solutions, such as chemical solutions that remove the cured film.

The novel compositions can be coated onto the surface of a substrate such as materials with low dielectric constant, silicon, silicon substrates coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures, any of the metal nitrides such as AlN; gallium arsenide and other such Group III/V compounds. The substrate may also be other antireflective coatings or underlayers, such as high carbon underlayers coated over the above mentioned substrates. The substrate may comprise any number of layers made from the materials described above.

The novel composition is coated on the substrate using techniques well known to those skilled in the art, such as dipping, spin coating or spraying. The film thickness of the composition ranges from about 3 nm to about 600 nm, such as, for example, about 5 nm to about 500 nm.

The composition may be coated onto a photoresist which is patterned with vias or trenches. The film thickness of the coating ranges from about 20 nm to about 900 nm, such as, for example, about 40 nm to about 700 nm depending on the depth of the via or trench features in the photoresist. The coating may further be heated on a hot plate or convection oven for a sufficient length of time to remove majority of the solvent and induce curing. The cure temperature may be from about 150° C. to about 400° C. for about 30 seconds to about 5 minutes, such as, for example, from about 200° C. to about 300° C. for about 1 to about 2 minutes.

In one application the photoresist is initially coated on the novel coating itself while in another application the novel coating is applied to an imaged photoresist film containing vias and/or trenches to act as a filling compound.

Photoresists can be any of the types used in the semiconductor industry, provided the photoactive compound in the photoresist substantially absorb at the exposure wavelength used for the imaging process. Photoresists useful for immersion lithography ca be used. Typically, photoresists suitable for imaging with immersion lithography may be used, where such photoresists have a refractive index higher than 1.85 and also are hydrophobic having water contact angle in the range of 75° to 95°.

To date, there are several major deep ultraviolet (uv) exposure technologies that have provided significant advancement in miniaturization, and have actinic radiation of 250 nm to 10 nm, such as 248 nm, 193 nm, 157 and 13.5 nm. Chemically amplified photoresist are often used. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818, 258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. Thus photoresists absorbing in the range of about 12 nm to about 250 nm are useful. The novel coatings can also be used in process with nanoimprinting and e-beam resists.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethylammonium hydroxide (TMAH), typically 2.38 weight % TMAH. The developer may further comprise surfactant(s). An optional heating step can be incorporated into the process prior to development and after exposure.

In one aspect of the inventive process of employing the novel composition is the process where the substrate is a patterned substrate such as a patterned organic polymer (e.g. a patterned photoresist) comprising, vias, trenches, holes or other hollow topographical features wherein after baking the film the method further comprises the step of removing the composition overlaying the top of the patterned photoresist with a suitable plasma or with a chemical stripper. Examples of suitable plasmas are those comprising fluorinated hydrocarbons, such as $CF_4$ or inorganic fluorinated compounds such as $SF_6$.

In one aspect of the inventive process where the patterned substrate is a patterned organic polymer layer, this process may further comprise the step of removing the patterned organic polymer with an oxygen plasma, thereby forming a negative tone image of the original patterned photoresist. In one embodiment of the inventive process the patterned organic polymer is a patterned photoresist.

In one embodiment when the patterned substrate is part of an electronic device, the novel composition alternatively can be employed as a filling material which is partially stripped in chemical solutions after curing of the film to form metal oxide. The remaining metal oxide film in the feature then can be used for high K (dielectric) materials as gate dielectrics to improve current leakage.

Advantageously the novel metal layer may be removed using a stripper which is a chemical solution, as described herein. The wet strippability of the metal oxide offers a simple and low cost rework-process comparing to dry etch procedure.

The compositions comprising polyols are important to have good filling performances as described in the comparative Example. The coated features were examined under a scanning electron microscope. Unexpectedly, without polyols, very large voids were observed under similar processing conditions. Coated films from novel composition comprising polyol had no void formation, while retaining other desirable coating properties such as coating uniformity, coating thickness, coating uniformity, coating defect or coating void formation. Formulation with added polyol also had good shelf life stability, where these formulations were stable at room temperature for several months or stable under forced aging of 40° C. for one week, and showing no changes in coating properties.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the extinction coefficient (k) values of the examples metal oxide coatings below were measured on a J. A. Woollam VASE32 ellipsometer.

The molecular weight of the polymers was measured on a Gel Permeation Chromatograph using a Water 2695 Alliance Separation Module, or equivalent equipped with a Waters Dual Wavelength UV Detector, Model 2487, or equivalent and a Waters Differential Refractometer, Model 2414, Dectector equivalent, a Shodex Columns set as follows: one Shodex GPC KF-801 ($1.5 \times 10^3$) column, Two Shodex GPC KF-802 ($5 \times 10^3$) columns and one Shodex GPC KF-804 ($4 \times 10^5$) column. The mobile phase was UV stabilized THF HPLC grade and the molecular weight standard was as set of polystyrene standards supplied by American Standards Corporation and Millipore Corporation or equivalent.

AZ®ArF Thinner was obtained from EMD Performance Materials Corp. (70, Meister Ave., Somerville, N.J.). Ti(IV), Butoxide Polymer (BTP), Pentaerythritol ethoxylate (3/4 EO/OH) and other chemicals, unless otherwise indicated, were purchased from the Sigma-Aldrich Corp (St. Louis, Mo., USA).

Synthesis Example 1

40 g of Ti(IV)BTP (Butoxide Polymer) polymer was dissolved in 52 g of ArF thinner solvent (70% PGMEA 30% PGME) and poured into the reaction vessel under $N_2$. The temperature was raised to 50° C. with stirring while trimethylsilanol 12 g was added dropwise in above TiBTP. The reaction was kept at 60° C. for 2 hours. 20 g of 1,2-cyclohexanedicarboxylic anhydride and 20 g of ArF thinner solvent were then mixed with the above reaction mixture and the reaction was continued at 60° C. for about one hour. After cooling down to room temperature overnight, the product was stored in a brown bottle and sealed carefully. An FT-IR spectrum of the product solution was taken in cyclohexane. The FT-IR resonance at 970 cm−1 was assigned to Ti—O—Si stretching frequency.

Synthesis Example 2

40 g of Ti(IV)BTP polymer was dissolved in 58 g of ArF thinner solvent and poured into the reaction vessel under $N_2$. The temperature was raised to 50° C. with stirring while trimethylsilanol 18 g was added dropwise in above TiBTP solution. The reaction was kept at 60° C. for 2 hours. 30 g of 1,2-cyclohexanedicarboxylic anhydride and 30 g of ArF thinner solvent were then mixed with the above reaction mixture and the reaction was continued at 60° C. for about one hour. After cooling down to room temperature overnight, the product was stored in a brown bottle and sealed carefully. An FT-IR spectrum of the product solution was taken in cyclohexane. The FT-IR resonance at 970 cm−1 was assigned to Ti—O—Si stretching frequency.

Synthesis Example 3

40 g of Ti(IV)BTP polymer was dissolved in 58 g of ArF thinner solvent and poured into the reaction vessel under $N_2$. The temperature was raised to 50° C. while stirring while trimethylsilanol 18 g was added dropwise in above TiBTP solution. The reaction was kept at 60° C. for 2 hours. 22 g of citraconic anhydride and 22 g of ArF thinner solvent were then mixed with the above reaction mixture and the reaction was continued at 60° C. for about one hour. After cooling down to room temperature overnight, the product was stored in a brown bottle and sealed carefully. An FT-IR spectrum of the product solution was taken in cyclohexane. The FT-IR resonance at 970 cm−1 was assigned to Ti—O—Si stretching frequency.

Synthesis Example 4

450 g of citraconic anhydride 600 g of Ti(IV) Butoxide Polymer and 1050 g of ArF thinner was mixed by stirring and heated in a flask under nitrogen. The reaction was maintained at 50° C. for about 4 hours. After cooling down to room temperature overnight, the product with 50% solid content was stored in a brown bottle. Proton NMR showed no anhydride carbonyl in the product. An FT-IR spectrum in cyclohexane showed a reduction of the peak at ~1100 cm$^{-1}$ due to Ti—OBu resonance and a new broad peak at 1570 cm$^{-1}$ due to Ti—OC(=O)R resonance.

Synthesis Example 5

40 g of Ti(IV)BTP polymer, 22.5 g of citraconic anhydride and 50 g of PGMEA/PGME 70:30 were mixed by stirring and heated in a flask under nitrogen. The reaction was maintained at 50° C. for about 2 hours. 2.5 g of nonafluorobutane-1-sulfonic acid in 15 g of PGMEA/PGME 70:30 was slowly added in the reaction vessel. The reaction was allowed to continue for another 2 hours at 50° C. After cooling down to room temperature, the product with 50% solid content was stored in a brown bottle. An FT-IR spectra taken in cyclohexane showed a reduction of the peak at ~1100 cm$^{-1}$ due to Ti—OBu resonance and a new broad peak at 1570 cm$^{-1}$ due to Ti—OC(=O)R resonance.

Synthesis Example 6

15 g of citraconic anhydride 40 g of Ti(IV) Butoxide Polymer and 55 g of ArF thinner were mixed by stirring and heated in a flask under nitrogen. The reaction was maintained at 50° C. for about 4 hour. After cooling down to room temperature overnight, the product with 50% solid content was stored in a brown bottle. Proton NMR has shown no anhydride in the product. An FT-IR spectra taken in cyclohexane showed a reduction of the peak at ~1100 cm$^{-1}$ due to Ti—OBu resonance and a new broad peak at 1570 cm$^{-1}$ due to Ti—OC(=O)R resonance.

Synthesis Example 7

200 g of Hf(IV) tetra n-butoxide was dissolved in 276 g of ArF thinner solvent and poured into the reaction vessel under N$_2$. The temperature was raised to 50° C. with stirring while trimethylsilanol 76 g was added dropwise in above solution. The reaction was kept at 60° C. for 2 hours. 127 g of 1,2-cyclohexanedicarboxylic anhydride and 127 g of ArF thinner solvent were then mixed with the above reaction mixture and the reaction was continued at 60° C. for about one hour. After cooling down to room temperature overnight, the product was stored in a brown bottle and sealed carefully.

Synthesis Example 8

200 g of Zr tetra n-butoxide was dissolved in 246.5 g of ArF thinner solvent and poured into the reaction vessel under N$_2$. The temperature was raised to 50° C. with stirring while trimethylsilanol 77.5 g was added dropwise in above solution. The reaction was kept at 60° C. for 2 hours. 103 g of 1,2-cyclohexanedicarboxylic anhydride and 103 g of ArF thinner solvent were then mixed with the above reaction mixture and the reaction was continued at 60° C. for about one hour. After cooling down to room temperature overnight, the product was stored in a brown bottle and sealed carefully.

Synthesis Example 9

200 g of Zr tetra t-butoxide was dissolved in 262 g of ArF thinner solvent and poured into the reaction vessel under N$_2$. The temperature was raised to 50° C. with stirring while trimethylsilanol 62 g was added dropwise in above solution. The reaction was kept at 60° C. for 2 hours. 103 g of 1,2-cyclohexanedicarboxylic anhydride and 103 g of ArF thinner solvent were then mixed with the above reaction mixture and the reaction was continued at 60° C. for about one hour. After cooling down to room temperature overnight, the product was stored in a brown bottle and sealed carefully.

Synthesis Example 10

40 g of Hf(IV) tetra n-butoxide was dissolved in 56 g of AZ®ArF Thinner solvent and poured into the reaction vessel under N$_2$. The temperature was raised to 50° C. while stirring and trimethylsilanol 15.4 g was added dropwise to the above solution with stirring under N$_2$. The reaction mixture was kept at 60° C. for 2 h. After this time, 32.4 g of p-toluene sulfonic acid monohydrate in 75.6 g of AZ®ArF Thinner solvent was added to the reaction mixture and the reaction was continued at 60° C. for one hour. After cooling down to room temperature overnight, the product was stored in a brown bottle and sealed carefully.

Formulation and Coating Example 1

20% wt/wt solutions containing of 14.6 wt % of metal polymer from Synthesis Example 1 (or any of Synthesis Example 2-6) and 5.4 wt % of triethanolamine were prepared in PGMEA/PGME 70:30 solvent. After sufficient mixing, the solution was spin-coated on the silicon wafer and baked at 250° C. for 60 seconds. The coated wafer showed good coating quality by XSEM picture.

Formulation and Coating Example 2

20% wt/wt solution containing of 12 wt % of metal polymer from Synthesis Example 1 and 8 wt % of Pentaerythritol ethoxylate (3/4 EO/OH) were prepared in PGMEA/PGME 70:30 solvent. After sufficient mixing, the solution was spin-coated on the silicon wafer and bake at 250° C. for 60 seconds. The coated wafer showed good coating quality by XSEM picture.

Formulation and Coating Example 3

20% wt/wt solutions containing of 10 wt % of metal polymer from Synthesis Example 4 and 10 wt % of Pentaerythritol ethoxylate (3/4 EO/OH) were prepared in PGMEA/PGME 70:30 solvent. After sufficient mixing, the solution was spin-coated on the silicon wafer and bake at 250° C. for 60 seconds. The coated wafer showed good coating quality by XSEM picture.

Formulation and Coating Example 4

25% wt/wt solutions containing of 22.0 wt % of metal polymer from Synthesis Example 7 (or any of Synthesis Example 7) and 3.0 wt % of triethanolamine were prepared in PGMEA/PGME 70:30 solvent. After sufficient mixing, the solution was spin-coated on the silicon wafer and bake at 250° C. for 60 seconds. The coated wafer showed good coating quality by XSEM picture.

Formulation and Coating Example 5

25 wt % solution containing 21.8 wt % of metal polymer from Synthesis Example 8 (or Synthesis Example 9) and 3.2 wt % of triethanolamine were prepared in PGMEA/PGME 70:30 solvent. After sufficient mixing, the solution was spin-coated on the silicon wafer and bake at 250° C. for 60 seconds. The coated wafer showed good coating quality by XSEM picture.

Formulation and Coating Example 6

A 25 wt % solution containing 20 wt % of metal polymer from Synthesis Example 8 and 5 wt % of triethanolamine was prepared in PGMEA/PGME 70:30 solvent. After sufficient mixing, the solution was spin-coated on the silicon wafer and baked at 250° C. for 60 seconds. The coated wafer showed good coating quality by XSEM picture.

Formulation and Coating Example 7

20 wt % solutions containing 14.6 wt % of metal polymer from Synthesis Example 10 and 5.4 wt % of triethanolamine was prepared in PGMEA/PGME 70:30 solvent. After sufficient mixing, the solution was spin-coated on the silicon wafer and baked at 250° C. for 60 seconds. The coated wafer showed good coating quality by XSEM picture.
Determination of Metal Wt % in Films after Baking Formulation examples 1, 2 or 3 were coated separately and baked at appropriate temperature, normally at 250° C./60 s-300° C./60 s on a silicon wafer. Metal wt % in the films were measured by elemental analysis and TGA weight loss measurement. The results from two methods were consistent. The measured total metal oxide content ranged from 20 to 40 wt % in films at 250° C./60 s-300° C./60 s baking conditions. The film was mostly comprised of titanium compounds with little silicon content based on elemental analysis in all cases.
Examples of Measurements of Dielectric Constants of Metal Oxide Films Formulation Example 4 and 6 were coated and baked at 250° C./60 s on a silicon wafer to obtain a metal oxide film targeting a film thickness of 200 nm. Based on capacity measurement using external HP3890A meter at 100 kHz, the dielectric constant K of the metal oxide films were calculated. Formulation Example 4 yielded a film with K=4.5 and Formulation Example 6 yielded a film with K=5.1, which are higher than K values of organic compounds (<4).

Via Filling Performance Evaluation Example 1

Formulation examples 1-7 were individually coated and baked at 250° C./60 s on silicon wafers which had 70, 80, 90, and 100 nm sized vias having a depth of 650 nm, where the vias were spaced in semi-dense and isolated pattern with respectively hole to space ratios of 1:1, 1:1.4 and 1:6. The coated wafers were examined under a scanning electron microscope and it was found that in all cases good filling performances was observed without any voids.

Comparative Via Filling Performance Evaluation Example 1

Individual 20 wt % solutions containing metal polymer from Synthesis Example 1 to 10 were prepared in PGMEA/PGME 70:30 solvent. After mixing to affect complete dissolution of the metal polymers, the solutions were individually spin-coated and baked at 250° C./60 s on silicon wafers which had 70, 80, 90, and 100 nm sized vias having a depth of 650 nm, were the vias were spaced in semi-dense and isolated pattern with respectively hole to space ratios of 1:1, 1:1.4 and 1:6. The individually coated wafers were examined under a scanning electron microscope. In all cases, significant voids were observed. These comparative examples demonstrated the unexpected result imparted by the presence of the polyol in the novel composition, which as demonstrated in "Via filling performance evaluation example 1", imparted good via filling performance under similar conditions.

We claim:
1. A composition comprising;
a) a soluble, multi-ligand-substituted metal compound of structure (I)

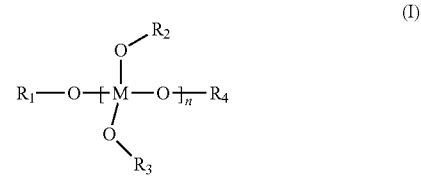

wherein M is a metal having (4) valence and n is 1 to 20, and wherein $R_1$, $R_2$, $R_3$, and $R_4$ are moieties independently selected from 1), 2), 3), or mixture thereof provided that at least one of $R_1$, $R_2$, $R_3$, and $R_4$ is selected from 1) and 2),
where
1) is an organic moiety (II),

wherein $R_8$ is selected from the group consisting of $C_2$-$C_{10}$ alkylene, $C_3$-$C_{12}$ branched alkylene, $C_5$-$C_{12}$ cycloalkylene, $C_2$-$C_{10}$ alkylene containing a C=C double bond, $C_3$-$C_{12}$ branched alkylene containing a C=C double bond, and $C_5$-$C_{12}$ cycloalkylene containing a C=C double bond, and further where $R_9$ is hydrogen or the alkyloxycarbonyl moiety (IV), where $R_{10}$ is $C_1$-$C_8$ alkyl group,

2) is a silicon bearing organic moiety having at least 2 carbons having structure (III)

wherein $R_5$ and $R_6$ are independently selected from $C_1$-$C_8$ alkyl, $C_3$-$C_{12}$ branched alkyl or aryl, $R_7$ is independently selected from $C_1$-$C_8$ alkyl, aryl, hydroxyl or siloxane of structure (V) where $R_{11}$ is hydrogen, a $C_1$-$C_8$ alkyl moiety, a $C_1$-$C_8$ alkyl moiety substituted with a hydroxyl group or an aryl moiety, and $R_{12}$ and $R_{13}$ are independently selected from $C_1$-$C_8$ alkyl moiety, a $C_3$-$C_{12}$ branched alkyl moiety or an aryl moiety and where p represents the number of repeat units in the siloxane moiety (V); and,

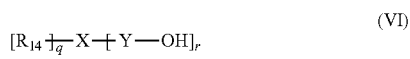
(V)

3) is an organic moiety selected from the group consisting of a $C_2$-$C_8$ alkyl, a $C_6$-$C_{16}$ aryl or substituted aryl, a $C_2$-$C_8$ alkyl carboxyl, a $C_6$-$C_{16}$ aryl or substituted aryl carboxyl, a fluorinated $C_2$-$C_8$ alkyl carboxyl, a fluorinated $C_6$-$C_{16}$ aryl or substituted aryl carboxyl, a $C_2$-$C_8$ alkyl sulfonyl, a $C_6$-$C_{16}$ aryl or substituted aryl sulfonyl, a fluorinated $C_2$-$C_8$ alkyl sulfonyl, a fluorinated $C_6$-$C_{16}$ aryl or substituted aryl sulfonyl, and mixtures thereof;

b) polyol compound having structure (VI)

(VI)

where X is C or N, where r is at least 2 and q ranges from 0-2, and where the sum of q and r is 4 when X is C and the sum of q and r is 3 when X is N, and further where $R_{14}$ is hydrogen, a $C_1$ to $C_8$ alkyl moiety or a $C_2$ to $C_8$ hydroxyalkylene moiety; and when X is N, Y is a $C_2$-$C_8$ alkylene moiety; when X is C, Y is independently chosen from a direct valence bond, a $C_2$-$C_8$ alkylene moiety or a moiety containing an alkoxy alkylene chain having structure (VII) where $R_{15}$ is a $C_2$ to $C_8$ alkylene moiety, t is 0 to 2 and t' is 1 to 2;

(VII)

and, c) a solvent.

2. A composition comprising;

a) a soluble, multi-ligand-substituted metal compound of structure (I)

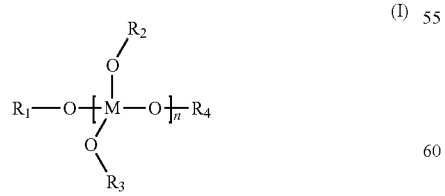
(I)

wherein M is a metal having (4) valence and n is 1 to 20, and wherein $R_1$, $R_2$, $R_3$, and $R_4$ are moieties independently selected from 1), 2), 3), or mixture thereof, where 1) is an organic moiety (II),

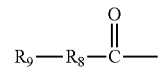
(II)

wherein $R_8$ is selected from the group consisting of $C_2$-$C_{10}$ alkylene, $C_3$-$C_{12}$ branched alkylene, $C_5$-$C_{12}$ cycloalkylene, $C_2$-$C_{10}$ alkylene containing a C=C double bond, $C_3$-$C_{12}$ branched alkylene containing a C=C double bond, and $C_5$-$C_{12}$ cycloalkylene containing a C=C double bond, and further where $R_9$ is hydrogen or the alkyloxycarbonyl moiety (IV), where $R_{10}$ is $C_1$-$C_8$ alkyl group,

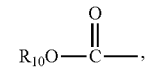
(IV)

2) is a silicon bearing organic moiety having at least 2 carbons having structure (III)

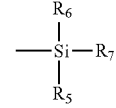
(III)

wherein $R_5$ and $R_6$ are independently selected from $C_1$-$C_8$ alkyl, $C_3$-$C_{12}$ branched alkyl or aryl, $R_7$ is independently selected from $C_1$-$C_8$ alkyl, aryl, hydroxyl or siloxane of structure (V) where $R_{11}$ is hydrogen, a $C_1$-$C_8$ alkyl moiety, a $C_1$-$C_8$ alkyl moiety substituted with a hydroxyl group or an aryl moiety, and $R_{12}$ and $R_{13}$ are independently selected from $C_1$-$C_8$ alkyl moiety, a $C_3$-$C_{12}$ branched alkyl moiety or an aryl moiety and where p represents the number of repeat units in the siloxane moiety (V); and,

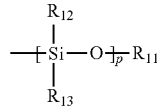
(V)

3) is an organic moiety selected from the group consisting of a $C_2$-$C_8$ alkyl, a $C_6$-$C_{16}$ aryl or substituted aryl, a $C_2$-$C_8$ alkyl carboxyl, a $C_6$-$C_{16}$ aryl or substituted aryl carboxyl, a fluorinated $C_2$-$C_8$ alkyl carboxyl, a fluorinated $C_6$-$C_{16}$ aryl or substituted aryl carboxyl, a $C_2$-$C_8$ alkyl sulfonyl, a $C_6$-$C_{16}$ aryl or substituted aryl sulfonyl, a fluorinated $C_2$-$C_8$ alkyl sulfonyl, a fluorinated $C_6$-$C_{16}$ aryl or substituted aryl sulfonyl, and mixtures thereof, and where $R_1$, $R_2$, $R_3$, and $R_4$ are selected from the group consisting of moiety 1), moiety 2) and mixtures thereof;

b) polyol compound having structure (VI)

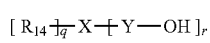

where X is C or N, where r is at least 2 and q ranges from 0-2, and where the sum of q and r is 4 when X is C and the sum of q and r is 3 when X is N, and further where $R_{14}$ is hydrogen, a $C_1$ to $C_8$ alkyl moiety or a $C_2$ to $C_8$ hydroxyalkylene moiety; and when X is N, Y is a $C_2$-$C_8$ alkylene moiety; when X is C, Y is independently chosen from a direct valence bond, a $C_2$-$C_8$ alkylene moiety or a moiety containing an alkoxy alkylene chain having structure (VII) where $R_{15}$ is a $C_2$ to $C_8$ alkylene moiety, t is 0 to 2 and t' is 1 to 2;

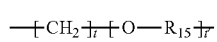

and,
c) a solvent.

3. A composition comprising;
a) a soluble, multi-ligand-substituted metal compound of structure (I)

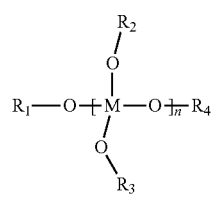

wherein M is a metal having (4) valence and n is 1 to 20, and wherein $R_1$, $R_2$, $R_3$, and $R_4$ are moieties independently selected from 1), 2), 3), or mixture thereof, where
1) is an organic moiety (II),

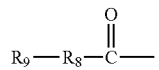

wherein $R_8$ is selected from the group consisting of $C_2$-$C_{10}$ alkylene, $C_3$-$C_{12}$ branched alkylene, $C_5$-$C_{12}$ cycloalkylene, $C_2$-$C_{10}$ alkylene containing a C=C double bond, $C_3$-$C_{12}$ branched alkylene containing a C=C double bond, and $C_5$-$C_{12}$ cycloalkylene containing a C=C double bond, and further where $R_9$ is hydrogen or the alkyloxycarbonyl moiety (IV), where $R_{10}$ is $C_1$-$C_8$ alkyl group,

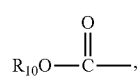

2) is a silicon bearing organic moiety having at least 2 carbons having structure (III)

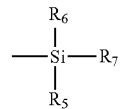

wherein $R_5$ and $R_6$ are independently selected from $C_1$-$C_8$ alkyl, $C_3$-$C_{12}$ branched alkyl or aryl, $R_7$ is independently selected from $C_1$-$C_8$ alkyl, aryl, hydroxyl or siloxane of structure (V) where $R_{11}$ is hydrogen, a $C_1$-$C_8$ alkyl moiety, a $C_1$-$C_8$ alkyl moiety substituted with a hydroxyl group or an aryl moiety, and $R_{12}$ and $R_{13}$ are independently selected from $C_1$-$C_8$ alkyl moiety, a $C_3$-$C_{12}$ branched alkyl moiety or an aryl moiety and where p represents the number of repeat units in the siloxane moiety (V); and,

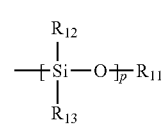

wherein the moiety 2) ranges from 30 mole % to 60 mole % of the total moles of moieties $R_1$, $R_2$, $R_3$, and $R_4$ in structure (I), and further where the organic moiety 1) of structure (II) ranges from 30 mole % to 60 mole % of the total moles of moieties $R_1$, $R_2$, $R_3$, and $R_4$ in structure (I); and,
3) is an organic moiety selected from the group consisting of a $C_2$-$C_8$ alkyl, a $C_6$-$C_{16}$ aryl or substituted aryl, a $C_2$-$C_8$ alkyl carboxyl, a $C_6$-$C_{16}$ aryl or substituted aryl carboxyl, a fluorinated $C_2$-$C_8$ alkyl carboxyl, a fluorinated $C_6$-$C_{16}$ aryl or substituted aryl carboxyl, a $C_2$-$C_8$ alkyl sulfonyl, a $C_6$-$C_{16}$ aryl or substituted aryl sulfonyl, a fluorinated $C_2$-$C_8$ alkyl sulfonyl, a fluorinated $C_6$-$C_{16}$ aryl or substituted aryl sulfonyl, and mixtures thereof;
b) polyol compound having structure (VI)

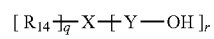

where X is C or N, where r is at least 2 and q ranges from 0-2, and where the sum of q and r is 4 when X is C and the sum of q and r is 3 when X is N, and further where $R_{14}$ is hydrogen, a $C_1$ to $C_8$ alkyl moiety or a $C_2$ to $C_8$ hydroxyalkylene moiety; and when X is N, Y is a $C_2$-$C_8$ alkylene moiety; when X is C, Y is independently chosen from a direct valence bond, a $C_2$-$C_8$ alkylene moiety or a moiety containing an alkoxy alkylene chain having structure (VII) where $R_{15}$ is a $C_2$ to $C_8$ alkylene moiety, t is 0 to 2 and t' is 1 to 2;

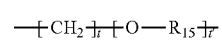

and,
c) a solvent.

4. The composition of claim 1 wherein the metal is selected from the group consisting of silicon (4), titanium (4), zirconium (4), tantalum (4), lead (4), hafnium (4), molybdenum (4), germanium (4), tin (IV), and tungsten (4).

5. The composition of claim 1 where the silicon bearing organic moiety 2) is selected from the group consisting of

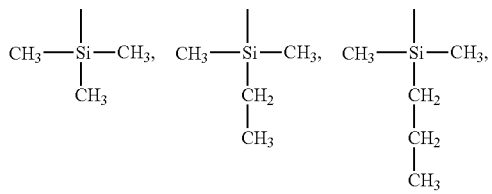

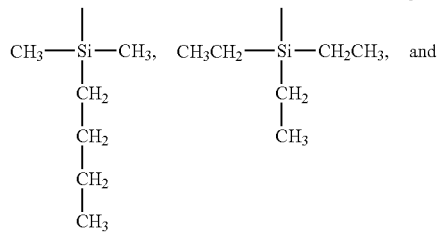

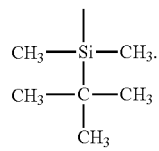

6. The composition of claim 1 wherein $R_7$ has structure (V).

7. The composition of claim 1 wherein the organic moiety 3) is selected from the group consisting of

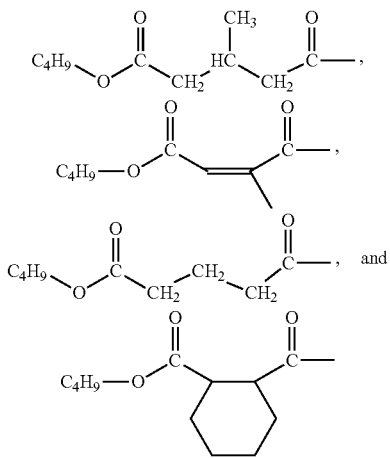

8. The composition of claim 1 wherein the polyol having structure (VI) has Y having structure (VII) and further where the polyol has a molecular weight less than 500 and a boiling point higher than 250° C.

9. The composition of claim 1 wherein the polyol having structure (VI) is chosen from the group consisting of tetraethylene glycol, triethylene glycol, glycerol, triethanolamine, diethanolamine, neopentyl glycol, glycerol propoxylate and pentaerythritol ethoxylate.

10. The composition of claim 1 where the polyol is selected from the group consisting of compounds having structure VIII, IX, X, XI, and XII

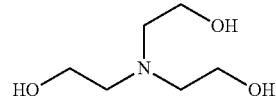

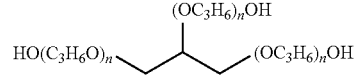

where n=1-2

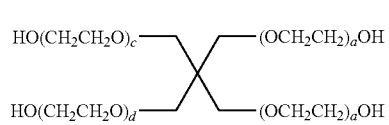

where a+b+c+d=3-4

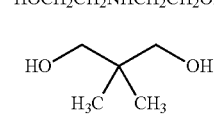

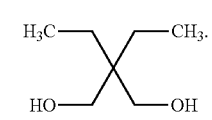

11. The composition of claim 1 where the polyol has a content less than 60 wt % but greater than 5 wt % of total solids in the composition.

12. The composition of claim 1 where the solvent is chosen from an alcohol, an ester, a ketone, a lactone, a diketones, an aromatic moieties, a carboxylic acid, amide or a mixtures thereof.

13. The composition of claim 1, further comprising at least one additional component selected from a group consisting of a thermal acid generator, a thermal base generator and a thermally activated peroxide.

14. The composition of claim 1, further comprising at least one additional component selected from a group consisting of surfactant, levelling agents, crosslinking additives and thermally activated catalysts.

15. The composition of claim 1, wherein in structure (I) n is 2 to 20.

16. The composition of claim 1, wherein in structure (I) n is 1.

17. A method of manufacturing an electronic device comprising:
  a. applying a composition from claim 1 onto a substrate; and,
  b. baking the film at a temperature between 150° C. to 400° C.

18. The method according to claim 17 where the substrate is a patterned substrate comprising topographical features wherein after baking the film the method further comprises the step of:
  c. removing the composition overlaying the top of the patterned substrate with a chemical stripper or with a fluorinated plasma etch.

19. The method according to claim 18 where the patterned substrate is a patterned organic polymer layer and where the method further comprises the step of:
   d. removing the patterned organic polymer with an oxygen plasma, thereby forming a negative tone image of the original patterned photoresist.

20. The method according to claim 17 where the substrate is a patterned substrate comprising hollow topographical features wherein after baking the film the method further comprises the step of:
   c. removing the composition with a chemical stripper or with a fluorinated plasma etch so that the hollow topographical features are partially filled with the metal oxide materials.

* * * * *